(12) United States Patent
Leydier

(10) Patent No.: US 6,490,646 B1
(45) Date of Patent: Dec. 3, 2002

(54) INTEGRATED CIRCUIT DEVICE MADE SECURE BY MEANS OF ADDITIONAL BUS LINES

(75) Inventor: Robert Leydier, Orsay (FR)

(73) Assignee: Schlumberger Systémes, Montrouge (FR)

( * ) Notice: Subject to any disclaimer, the term of this patent is extended or adjusted under 35 U.S.C. 154(b) by 0 days.

(21) Appl. No.: 09/332,581

(22) Filed: Jun. 14, 1999

(30) Foreign Application Priority Data

Jun. 15, 1998 (FR) .............................................. 98 07530

(51) Int. Cl.[7] .............................................. G06F 13/00
(52) U.S. Cl. ........................ 710/301; 710/74; 713/193; 713/190
(58) Field of Search ................................ 710/300–301, 710/305, 313, 105, 106, 74; 713/200–202, 164, 161, 165, 171, 190, 193

(56) References Cited

U.S. PATENT DOCUMENTS

| | | | | |
|---|---|---|---|---|
| 4,916,333 A | * | 4/1990 | Kowalski | 326/68 |
| 5,237,609 A | * | 8/1993 | Kimura | 713/193 |
| 5,367,571 A | * | 11/1994 | Bowen et al. | 380/20 |
| 5,379,344 A | * | 1/1995 | Larsson et al. | 380/23 |
| 6,100,995 A | * | 8/2000 | Itoh | 358/1.16 |

FOREIGN PATENT DOCUMENTS

| | | |
|---|---|---|
| EP | 0 279 712 A | 8/1988 |
| EP | 0 298 848 A | 1/1989 |

OTHER PUBLICATIONS

D. Paret: "Microcontroleurs et Protection de Code", Electronique Radio Plans, No. 527, Oct. 1, 1991, pp. 69–74, XP000265630, p. 71, col. 1, line 24 –line 35.

* cited by examiner

*Primary Examiner*—Peter Wong
*Assistant Examiner*—Raymond N Phan
(74) *Attorney, Agent, or Firm*—Cohen, Pontani, Lieberman & Pavane

(57) ABSTRACT

An integrated circuit device adapted to be incorporated into a portable article having a memory, in particular of a card format. The device includes a central processor unit, at least one memory, at least one data input/output pad, n address bus lines connecting the central processor unit to the memory and/or to the input/output pad to carry address bits, and D data bus lines connecting the central processor unit to the memory and/or to the input/output pad for conveying data bits. At least one address line from the address bus and the data bus is associated with an additional line for conveying bits that are complementary to the bits conveyed over the address bus line or data bus line.

6 Claims, 4 Drawing Sheets

INTEGRATED CIRCUIT DEVICE MADE SECURE BY MEANS OF ADDITIONAL BUS LINES

FIELD OF THE INVENTION

The invention relates to integrated circuit devices for incorporation in portable articles, and in particular in portable articles having the smart card format.

BACKGROUND OF THE INVENTION

Smart cards are generally used in applications where it is essential for confidential data to be stored and processed in a secure manner. For example, such cards can be used for applications in the fields of health, and pay TV, or indeed as "electronic purses".

They comprise a plastic card body in which an integrated circuit device is incorporated. The device is either an electronics module including an integrated circuit chip or the integrated circuit chip itself.

An integrated circuit chip typically includes a central processor unit (CPU) which uses bus lines to control and distribute data and addresses involving storage in memories of said chip that may be volatile or non-volatile.

The logic gates constituting the integrated circuits are made with CMOS technology. They are constituted by PMOS transistors and by NMOS transistors. The gates draw current whenever the transistors change from a conductive state to a non-conductive state, or vice versa. Furthermore, the connections between the gates, in particular the bus lines, constitute capacitances which likewise draw electrical current while they are being charged. This applies in particular when the bus lines are required to carry logic state 1.

Thus, the current drawn by an integrated circuit device as a function of time varies depending on the tasks performed by such device.

Monitoring current as a function of time thus provides an electrical signature representative of the activity of the integrated circuit device. By analyzing the electrical signature, and more specifically analyzing its amplitude as a function of time, this can reveal information about that activity. Such analysis enables attackers to gain access to confidential information, e.g. secret keys, that are carried by the bus lines and that are contained in the memories of the integrated circuit, or indeed to follow the flow of instructions opening the way to attack secrets by analyzing times that are characteristic of the current drawn by the integrated circuit during a transaction.

For the purpose of avoiding signatures being analyzed in this way, some methods in the state of the art propose using algorithms that enable operations to be triggered at instants that are pseudo-random. Other methods propose generating noisy power supply currents that are rich in random information, or indeed in erroneous operations.

The above-mentioned methods in the state of the art suffer from numerous drawbacks. In particular, they monopolize certain resources of the device which could be used for performing other operations. In addition, such methods are not reliable since techniques for analyzing the current drawn in sequences stimulated by particular commands are highly effective. They make it possible to ultimately obtain the looked-for confidential information.

SUMMARY OF THE INVENTION

One object of the present invention is to make confidential data stored in memory more secure by making analysis of the electrical signatures of integrated circuit devices more difficult.

This and other objects are attained in accordance with one aspect of the invention which is directed to an integrated circuit device adapted to be incorporated in a portable article having a memory, in particular an article of a card format. The device comprises a central processor unit; at least one memory; at least one data input/output pad; n address bus lines connecting the central processor unit to the memory and/or to the input/output pad to carry address bits; and p data bus lines connecting the central processor unit to the memory and/or to the input/output pad for conveying data bits. At least one line from the address bus lines and the data bus lines is associated with an additional line for conveying bits that are complementary to the bits conveyed over the at least one line.

Thus, by transferring two data items, e.g. 1 on one data (or address) bus line and 0 on its corresponding additional line, the same amount of current is drawn as would be drawn by transferring a data pair comprising 0 on the same data (or address) bus line and 1 on its corresponding additional line. As a result, the current drawn is always the same and it is no longer possible to determine the nature of the bits transported on the bus lines by analyzing the electrical signature of the device in operation.

BRIEF DESCRIPTION OF THE DRAWINGS

The invention will be better understood on reading the following non-limiting explanation taken together with reference to the accompanying drawings, in which.

DETAILED DESCRIPTION OF THE INVENTION

By way of example, the present invention is described with a specific application to smart cards. Nevertheless, it will be understood that the invention applies generally to any integrated circuit device that is designed to be incorporated in a portable article having a memory, such as a subscriber identity module (SIM) in the format for cell phones, or an electronic label.

Smart cards are standard portable articles that operate with or without making physical contact and that are defined, in particular, in ISO standards 78-10, 78-16, and 14443, the content of which is hereby incorporated by reference.

Figure 1:
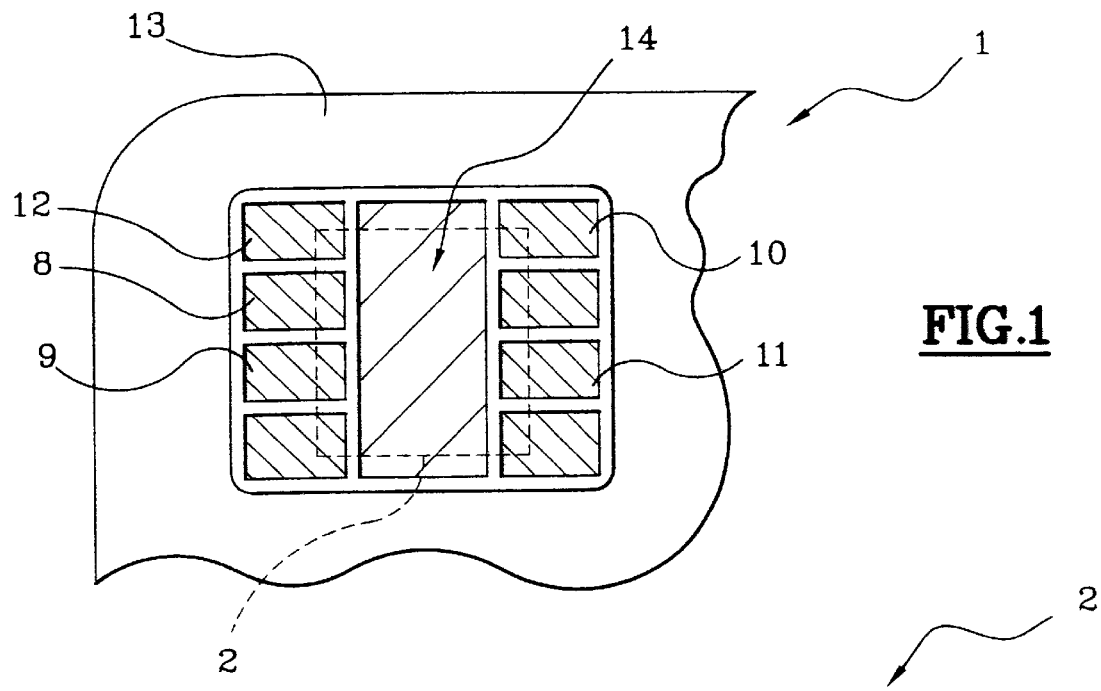
FIG. 1 is a plan view of an electronics module having an integrated circuit chip whose contact areas are flush with the surface of a card body.
Figure 2:
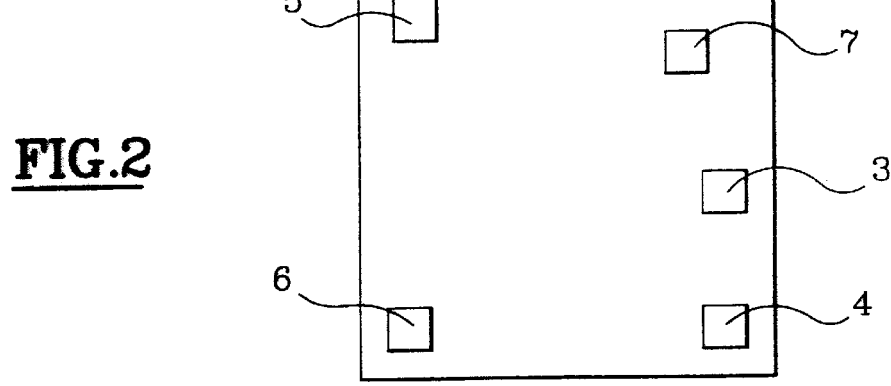
FIG. 2 is a plan view of an integrated circuit chip and its connection pads.

Thus, as can be seen more clearly in FIGS. 1 and 2, cards 1 that operate by means of physical contact comprise a respective integrated circuit chip 2 having at least five contact pads 3, 4, 5, 6, and 7 which are electrically connected via wires (not shown) respectively to five contact areas 8, 9, 10, 11, and 12 that are flush with the surface of a card body 13. A Reset contact pad 3 is connected to a Reset contact area 8, a Clock contact pad 4 is connected to a Clock contact area 9, a Vss contact pad 5 is connected to a Vss contact area 10, an input/output (I/O) contact pad 6 is connected to an I/O contact area 11, and an Idd contact pad 7 is connected to a Idd contact area 12.

The assembly comprising the chip 2, the conductor wires, and the contact areas 8, 9, 10, 11, and 12, generally comprises an electronics module 14 which is incorporated in the card body 13.

The integrated circuit device of the invention is specifically the electronics module 14 carrying the areas 8, 9, 10, 11, and 12, and including the chip 2, or else it is the chip 2 itself.

The integrated circuit of the device of the invention has various functional units. In particular, it has a central processor unit CPU, volatile memory RAM, and/or non-volatile memory ROM, EEPROM. It may have other units or subunits for said units, for example a crypto-processor intended more particularly for cryptographic encoding of data and requiring specialized calculation structures.

Figure 3:
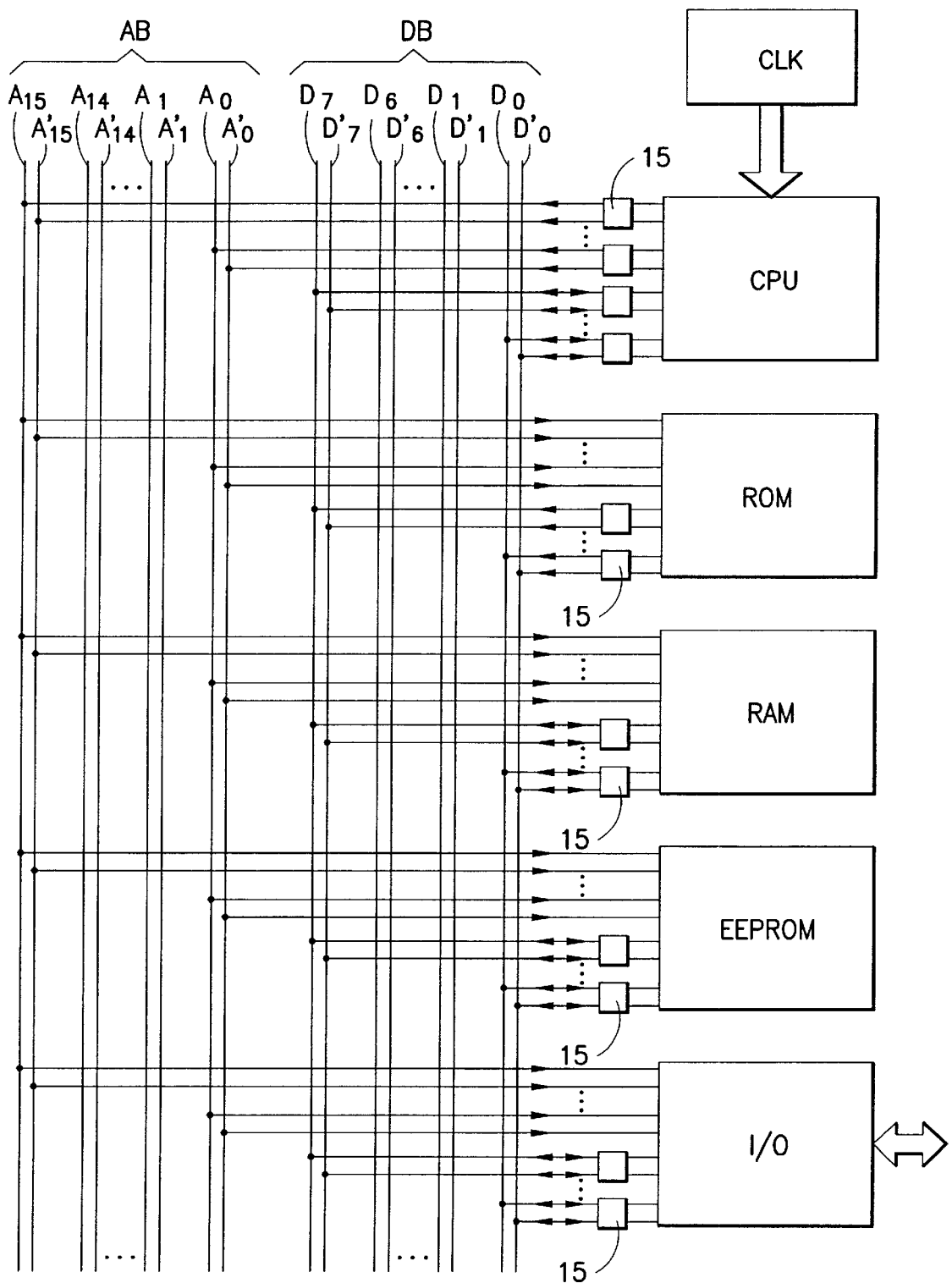
FIG. 3 is a schematic circuit diagram showing the various functional elements constituting an integrated circuit implemented in accordance with the invention.

In addition, the integrated circuit has an address bus AB and a data bus DB (see FIG. 3).

The address bus AB has n address bus lines connecting the CPU to the memories RAM, ROM, EEPROM, and to the I/O pad, where n is an integer number greater than or equal to 1. In FIG. 3, n is equal to 16, and the 16 address bus lines are referenced $A_0, A_1, \ldots, A_{15}$.

The data bus DB comprises p data bus lines connecting the CPU to the memories RAM, ROM, EEPROM, and to the I/O pad, where p is an integer number greater than or equal to 1. In FIG. 3, p is equal to 8 and the eight bus data lines are referenced $D_0, D_1, \ldots, D_7$.

Each address bus line $A_0, A_1, \ldots, A_{15}$ can carry a logic value 0 or a logic value 1 representing a bit of determined weight in an address that is encoded on 16 bits. The bit is conveyed in one direction only from the CPU to the memories RAM, ROM and EEPROM, or the I/O pad, as appropriate.

Each data bus line $D_0, D_1, \ldots, D_7$ is capable of conveying a logic value 0 or a logic value 1 constituting a bit of determined weight in a data item encoded on 8 bits. This takes place, depending on circumstances, in one direction only, or in both directions. The possible directions in which a bit can be conveyed are indicated by arrows in FIG. 3.

Figure 4:
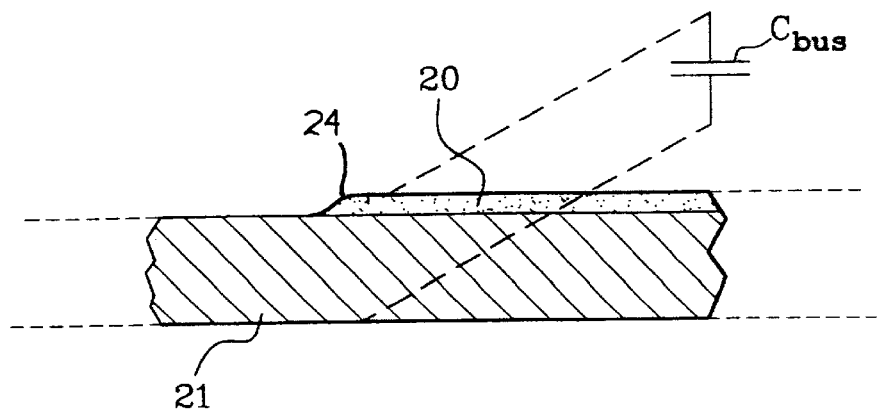
FIG. 4 is a cross-section taken through a bus line deposited on the silicon substrate of an integrated circuit chip.

The address bus lines $A_0, A_1, \ldots, A_{15}$, and the data bus lines $D_0, D_1, \ldots, D_7$ are conductor lines constituted by a metallized layer 24 deposited on a thick layer of silicon oxide 20 itself deposited on the silicon substrate 21 of the chip 2. As can be seen in FIG. 4, the thickness of a bus line is on the order of microns, e.g. 0.7 $\mu$m. The width of a bus line is also very small, e.g., about 2 $\mu$m. The length of a line can be considerable, as much as 8 mm. Under such circumstances, the area of a bus line is on the order of 2×8000=16,000 $\mu m^2$.

According to the invention, at least one address bus line $A_0, A_1, \ldots, A_{15}$ or at least one data bus line $D_0, D_1, \ldots, D_7$ is associated with an additional bus line.

In the preferred embodiment of the invention as shown in FIG. 3, all 16 address bus lines $A_0, A_1, \ldots, A_{15}$ and all eight data bus lines $D_0, D_1, \ldots, D_7$ are associated respectively with 16 additional lines $A'_0, A'_1, \ldots, A'_{15}$ and eight additional lines $D'_0, D'_1, \ldots, D'_7$.

As an example, each additional bus line is constituted like the bus line with which it is associated, by a metallized layer deposited on the thick oxide 20 of the silicon substrate 21 of the chip, immediately beside the line with which it is associated, and therefore it follows the same path over the active face of the circuit. Also, each additional bus line is of an area that is equivalent to that of the address bus line or the data bus line with which it is associated.

In other examples, the additional lines do not follow the same paths as the bus lines with which they are associated, but they nevertheless have a capacitance $C'_{bus}$ which approximate the capacitance $C_{bus}$ of the bus lines.

Figure 5:
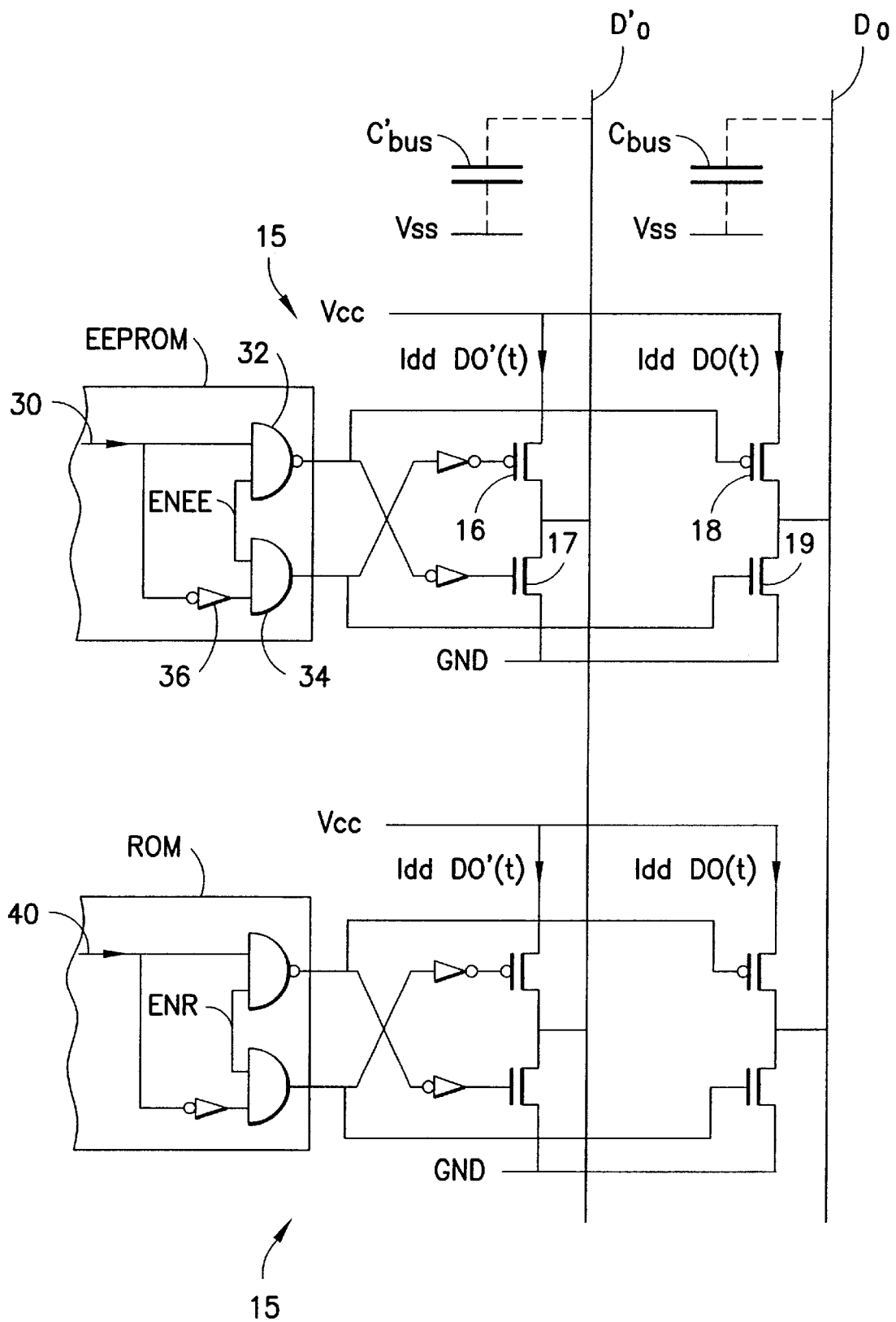
FIG. 5 is a more detailed depiction of the embodiment of FIG. 3, and shows a circuit diagram of the bus line connections and the additional line connections to the ROM and EEPROM memories.

The address bus lines $A_0, A_1, \ldots, A_{15}$ and the data bus lines $D_0, D_1, \ldots, D_7$ are, like the additional bus lines $A'_0, A'_1, A'_{15}$ and $D'_0, D'_1, \ldots, D'_7$ electrically connected to the functional units with which they are associated by dual three-state amplifiers 15. This is illustrated in FIG. 5 only with respect to data bus line $D_0$ and additional bus line $D'_0$ for the sake of simplifying the explanation. These dual three-state amplifiers 15 have gates which controllably connect the bus lines to the functional units with which they are associated, e.g. the ROM and the EEPROM.

As shown in FIG. 5, the output signal 30 of the EEPROM is provided as a direct input to NAND gate 32 and also to AND gate 34 via inverter 36. The other input to both of the NAND gate and the AND gate is the ENEE signal (discussed below). A similar arrangement is shown in FIG. 5 for the ROM output signal 40 and signal ENR (discussed below). The descriptive explanation which follows pertains only to the EEPROM in the interest of brevity.

A dual three-state amplifier 15 of the invention includes a first PMOS transistor 16 connected in series with a first NMOS transistor 17 between power source VCC and GND, and also a second PMOS transistor 18 connected in series with the second NMOS transistor 19. The first PMOS transistor 16 and the second NMOS transistor 19 are controlled by the same control signals at the output of AND gate 34, and the first NMOS transistor 17 and the second PMOS transistor 18 are controlled by the same control signals at the output of NAND gate 32.

In FIG. 5, the control signals ENR (ENABLE ROM) and ENEE (ENABLE EEPROM) are shown. These are conventional, CPU-generated signals typically available in a ROM and EEPROM which respectively control access to the bus lines connected to the memory ROM and to the memory EEPROM. Only one of these control signals is active at any given time. Thus, when the control signal ENR is active (i.e., when a logic 1 is sent through the line corresponding to ENR), only the dual three-state amplifiers for the ROM are capable of circulating data or addresses coming in or going out of the ROM (e.g., imparting their 0 or 1 logic signals to the bus lines or to the additional bus lines with which the ROM is connected). The same goes for the ENEE control signal. Under such circumstances (i.e., when ENR is a logic 1 and, therefore, ENEE is a logic 0), every dual three-state amplifier 15 connected to the EEPROM memory is in a high impedance mode to "disconnect" it from the bus lines $D_0$ and $D'_0$ because none of the transistors of this amplifier is conductive. Conversely, when the control signal ENEE is active (i.e, ENEE is a logic 1), only the dual three-state amplifiers associated with the EEPROM are in a position to impart their 0 or 1 logic signals on output 30 to the bus lines or the additional bus lines with which the EEPROM is associated. Under such circumstances, every three-state amplifier 15 connected to the ROM memory is in a high impedance state because none of the transistors in such amplifier is conductive.

By way of example, when the signal ENEE is active and the signal 30 from the EEPROM memory is at logic level 1, the voltage on the data bus $D_0$ will be a logic level 1 and the voltage on the additional data bus $D'_0$ will be a logic level 0. Thus, a 1 data bit on output line 30 is transmitted to the bus line $D_0$ while a 0 data bit, complementary to the above-mentioned 1 data bit, is simultaneously provided at the additional bus line $D'_0$.

The above-explained arrangement is not only applied to all of the data bus lines $D_0, D_1, \ldots, D_7$ associated with the additional lines $D'_0, D'_1, \ldots, D'_7$, but also to all of the address bus lines $A_0, A_1, \ldots, A_{15}$ associated with the additional lines $A'_0, A'_1, \ldots, A'_{15}$.

Thus, for each logical data or address item respectively carried by the bus DB or the bus AB, a complementary logical data or address item is carried simultaneously by the additional bus. Let a be the number of 1 bits on the data bus. Let b be the number of 1 bits on the additional data bus. For an 8-bit microcontroller, the data bus has 8 bits. Thus, the number of 1 bits on the data bus as a whole is such that a+b=8. Let c be the number of 1 bits for the address bus. Let d be the number of 1 bits for the additional address bus. For a microcontroller capable of addressing 65536 bytes, the address bus has 16 bits. Thus, the number of 1 bits for the address bus as a whole is such that c+d=16.

By way of example, we consider an instruction whose binary code is 10011101, and whose hexadecimal code is 9D. Each of the 8 bits is carried simultaneously, depending on its significance, over a respective data bus line $D_0, D_1, D_2, D_3, D_4, D_5, D_6$, or $D_7$, and the complementary logic number, in this case constituted by the 8 bits 01100010 is likewise carried simultaneously by the respective additional lines $D'_0, D'_1, D'_2, D'_3, D'_4, D'_5, D'_6$, and $D'_7$. The total number of 1 bits making up the logic word 10011101 and making up its complement 01100010 is equal to 8.

An advantage of the device of the invention is described in detail below.

In an integrated circuit device of the prior art or of the invention, the area of the bus lines integrated in the active face of the chip 2 is, as mentioned above (FIG. 4), liable to be as much as 16,000 $\mu m^2$. These lines constitute the first electrode of a parasitic capacitance $C_{bus}$, where the second electrode is the substrate 21 of the integrated circuit and the dielectric is the layer of silicon oxide 20 deposited on the active face of the chip 2. The parasitic capacitance $C_{bus}$ associated with each bus line is of picofarad order, and each time a 1 bit is carried by a bus line, this capacitance $C_{bus}$ consumes electrical power as it charges. This electrical power consumption is the origin of the variations in current consumption by the integrated circuit as a function of time Idd(t), and analyzing such current consumption provides an electrical signature that reveals the activity of the circuit.

In the prior art device, analyzing electrical signatures gives access to information, data or addresses, as carried by the bus lines since the current Idd(t) from the source of Vcc is a function of the bits carried.

In contrast, in an integrated circuit device of the invention, current consumption Idd(t) is independent of the data or the address carried by the bus lines. This current Idd(t) is constituted by summing the currents drawn by the conventional bus lines and by the additional bus lines, and that is equal to a constant when the capacitances $C'_{bus}$ of the additional bus lines are equivalent to the capacitances $C_{bus}$ of the bus lines with which they are associated, as in an advantageous embodiment of the invention.

Figure 6:
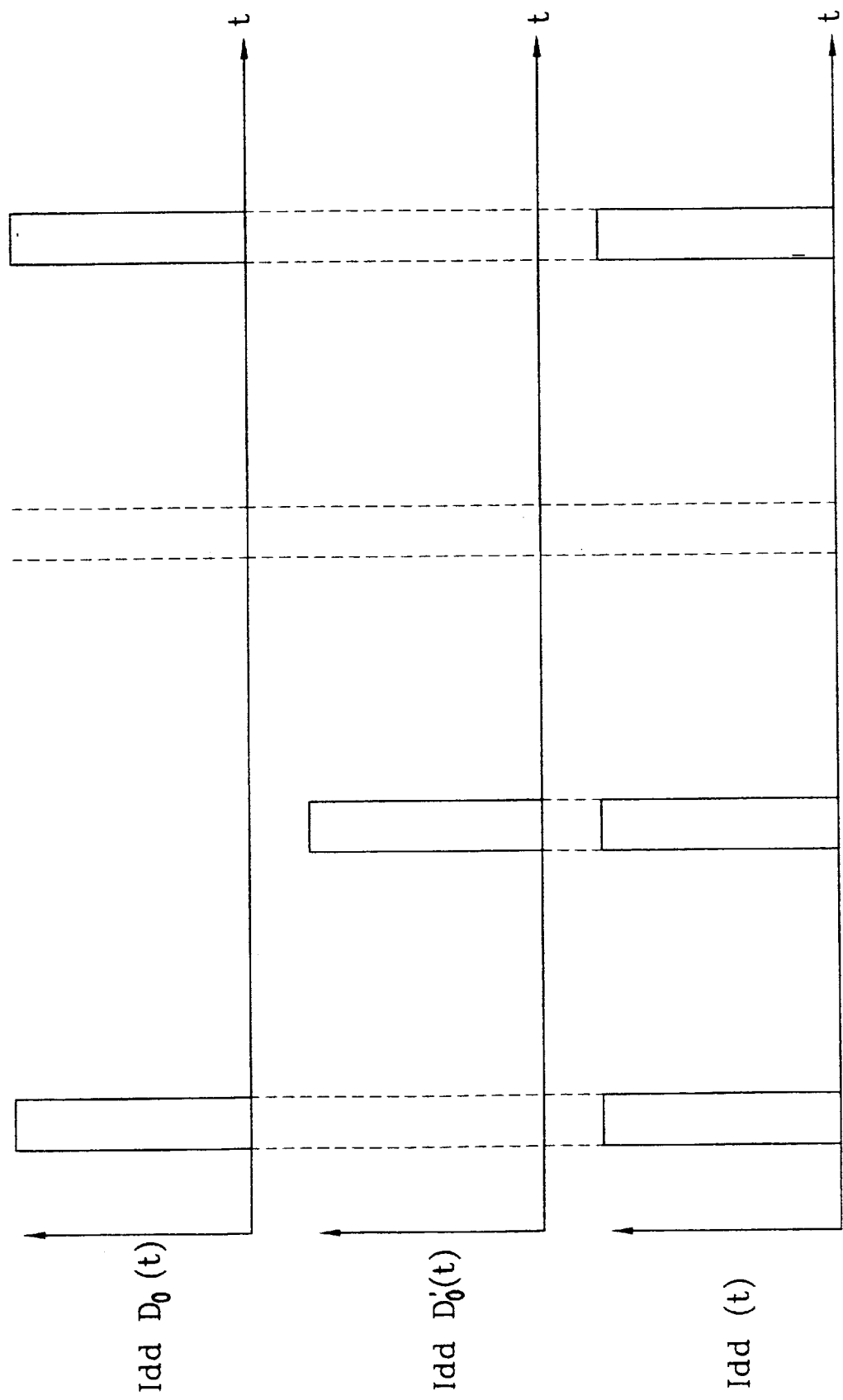
FIG. 6 has three graphs to show the currents drawn by using a bus line, its additional line, and the assembly comprised by both of said lines.

For example, as shown in FIG. 6 which relates to the transmission of data bits on data line $D_0$, Idd(t)=Idd DO(t)+ Idd DO' (t), regardless of the particular bits carried by data line $D_0$. Idd DO(t) and Idd DO' (t) are shown in FIG. 5 to flow, respectively, through bus lines $D_0$ and $D'_0$.

Although preferred embodiments of the invention have been disclosed in detail herein, it should be understood that various modifications thereto will be readily apparent to anyone with ordinary skill in the art. For example, the integrated circuit device can be provided with additional means for the purpose of guaranteeing complete security of any confidential information it may contain. This and other modifications are intended to fall within the scope of the present invention as defined by the following claims.

What is claimed is:

1. An integrated circuit device adapted to be incorporated into a portable article having a memory, the device comprising at least:

a central processor unit;

at least one memory;

at least one data input/output pad;

n address bus lines connecting the central processor unit to the memory and/or to the input/output pad to carry address bits; and p data bus lines connecting the central processor unit to the memory and/or to the input/output pad for conveying data bits;

wherein at least one line from the address bus lines and the data bus lines is associated with an additional line for conveying bits that are complementary to the bits conveyed over said at least one line.

2. A device according to claim 1, wherein the additional line has a capacitance equivalent to a capacitance of the address bus line or the data bus line with which it is associated.

3. A device according to claim 1, wherein each of the n address bus lines is associated with a respective additional line.

4. A device according to claim 1, wherein each of the p data bus lines is associated with a respective additional bus line.

5. A device according to claim 3, wherein the complementary bits on the additional lines form data or address logic values that are complementary to the logic values conveyed by the bus.

6. A device according to claim 1, wherein for each line, a dual amplifier is used.

\* \* \* \* \*